(12) United States Patent
Fulford et al.

(10) Patent No.: US 11,557,657 B2
(45) Date of Patent: Jan. 17, 2023

(54) HIGH DENSITY 3D LAYOUT ENHANCEMENT OF MULTIPLE CMOS DEVICES

(71) Applicant: Tokyo Electron Limited, Tokyo (JP)

(72) Inventors: H. Jim Fulford, Marianna, FL (US); Mark I. Gardner, Cedar Creek, TX (US)

(73) Assignee: Tokyo Electron Limited, Tokyo (JP)

( * ) Notice: Subject to any disclaimer, the term of this patent is extended or adjusted under 35 U.S.C. 154(b) by 19 days.

(21) Appl. No.: 17/237,609

(22) Filed: Apr. 22, 2021

(65) Prior Publication Data

US 2022/0140112 A1 May 5, 2022

Related U.S. Application Data

(60) Provisional application No. 63/107,774, filed on Oct. 30, 2020.

(51) Int. Cl.
*H01L 27/092* (2006.01)
*H01L 21/8234* (2006.01)
*H01L 27/06* (2006.01)
*H01L 21/8238* (2006.01)
*H01L 29/786* (2006.01)
(Continued)

(52) U.S. Cl.
CPC .... *H01L 29/66666* (2013.01); *H01L 21/8221* (2013.01); *H01L 21/823412* (2013.01); *H01L 21/823481* (2013.01); *H01L 21/823487* (2013.01); *H01L 21/823878* (2013.01); *H01L 21/823885* (2013.01); *H01L 27/0688* (2013.01); *H01L 27/088* (2013.01);
(Continued)

(58) Field of Classification Search
CPC . H01L 27/0688; H01L 27/088; H01L 27/092; H01L 21/8221; H01L 21/823487; H01L 21/823885; H01L 21/823481; H01L 21/823878; H01L 29/7827; H01L 29/78642; H01L 29/66666
See application file for complete search history.

(56) References Cited

U.S. PATENT DOCUMENTS 5,612,563 A * 3/1997 Fitch ................. H01L 21/76897
257/E29.267
6,882,006 B2 * 4/2005 Maeda ................ H01L 29/7827
257/329
(Continued)

*Primary Examiner* — Michael M Trinh
(74) *Attorney, Agent, or Firm* — Oblon, McClelland, Maier & Neustadt, L.L.P.

(57) ABSTRACT

Aspects of the present disclosure provide a method of fabricating a semiconductor device. For example, the method can include forming a multilayer stack on a substrate. The multilayer stack can include alternate metal layers and dielectric layers. The method can also include forming at least one opening through the multilayer stack to uncover the substrate and forming at least two vertical channel structures within the opening that are stacked on each other. The vertical channel structures can have source, gate and drain regions being in contact with the metal layers of the multilayer stack, respectively. The method can also include removing a central portion of the vertical channel structures and filling the central portion of the vertical channel structures with a dielectric core. The dielectric core can isolate the vertical channel structures from each other and from the substrate.

9 Claims, 12 Drawing Sheets

(51) Int. Cl.
*H01L 29/66* (2006.01)
*H01L 29/78* (2006.01)
*H01L 27/088* (2006.01)
*H01L 21/822* (2006.01)

(52) U.S. Cl.
CPC ........ *H01L 27/092* (2013.01); *H01L 29/7827* (2013.01); *H01L 29/78642* (2013.01)

(56) References Cited

U.S. PATENT DOCUMENTS

| | | | |
|---|---|---|---|
| 11,302,587 B2* | 4/2022 | Gardner | H01L 21/823828 |
| 2011/0012085 A1* | 1/2011 | Deligianni | H01L 29/78642 |
| | | | 257/E21.409 |
| 2020/0118996 A1* | 4/2020 | Parikh | H01L 21/823481 |
| 2021/0351109 A1* | 11/2021 | Sato | H01L 27/11565 |
| 2022/0102533 A1* | 3/2022 | Gardner | H01L 29/7827 |
| 2022/0102552 A1* | 3/2022 | Fulford | H01L 29/7841 |
| 2022/0139783 A1* | 5/2022 | Gardner | H01L 29/78696 |
| | | | 438/154 |
| 2022/0139786 A1* | 5/2022 | Gardner | H01L 29/78642 |
| | | | 438/212 |

* cited by examiner

HIGH DENSITY 3D LAYOUT ENHANCEMENT OF MULTIPLE CMOS DEVICES

INCORPORATION BY REFERENCE

This present disclosure claims the benefit of U.S. Provisional Application No. 63/107,774, "High Density 3D Layout Enhancement of Multiple CMOS devices" filed on Oct. 30, 2020, which is incorporated herein by reference in its entirety.

FIELD OF THE INVENTION

The present disclosure relates to semiconductor fabrication, and, more particularly, to methods of fabricating high density 3D semiconductor device designs.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In the manufacture of a semiconductor device, for example especially on the microscale or nanoscale, various fabrication processes are executed such as film-forming depositions, etch mask creation, patterning, material etching and removal, and doping treatments. These processes are performed repeatedly to form desired semiconductor device elements on a substrate. With microfabrication, transistors have been created in one plane with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

3D integration is seen as a viable option to continue semiconductor scaling. As the contacted gate pitch reaches its scaling limit due to manufacturing variability and electrostatic device limitations, 2D transistor density scaling stops.

SUMMARY 3D integration, i.e., the vertical stacking of multiple devices, aims to overcome these scaling limitations by increasing transistor density in volume rather than area. Complementary metal oxide semiconductor (CMOS) very-large-scale integration (VLSI) scaling, as used for example in CPU or GPU products, is exploring adoption of 3D integration as a primary means of moving the semiconductor roadmap forward, and thus desires enabling technologies. One such technology can take advantage of thermal bonding of separate nanoplane dielectric layer stacks on separate substrates to form a combined dielectric layer stack and increase resulting transistor density.

Aspects of the present disclosure provide a method of fabricating a semiconductor device. For example, the method can include forming a multilayer stack on a substrate. In an embodiment, the multilayer stack can include alternate metal layers and dielectric layers. The method can also include forming at least one opening through the multilayer stack to uncover the substrate and forming at least two vertical channel structures within the opening that are stacked on each other. In an embodiment, the vertical channel structures can have source, gate and drain regions being in contact with the metal layers of the multilayer stack, respectively. The method can also include removing a central portion of the vertical channel structures and filling the removed central portion of the vertical channel structures with a dielectric core. In an embodiment, the vertical channel structures can be isolated from each other and from the substrate by the dielectric core.

For example, the vertical channel structures can be of different channel types.

In an embodiment, the vertical channel structures can be formed by: forming a first epitaxial material on the substrate, the first epitaxial material covering at least a portion of a vertical sidewall of a first one of the dielectric layers of the multilayer stack; forming a first source region of the vertical channel structures on the first epitaxial material with a first type channel material, the first source region covering a vertical sidewall of a first one of the metal layers of the multilayer stack above the first dielectric layer; forming a first gate region of the vertical channel structures on the first source region with a first gate material, the first gate region covering a vertical sidewall of a second one of the metal layers of the multilayer stack above the first metal layer; forming a first drain region of the vertical channel structures on the first source and gate regions with the first type channel material, the first drain region covering a vertical sidewall of a third one of the metal layers of the multilayer stack above the second metal layer; forming a second epitaxial material on the first drain region, the second epitaxial material covering at least a portion of a vertical sidewall of a second one of the dielectric layers of the multilayer stack above the third metal layer; forming a second source region of the vertical channel structures on the second epitaxial material with a second type channel material, the second source region covering a vertical sidewall of a fourth one of the metal layers of the multilayer stack above the second dielectric layer; forming a second gate region of the vertical channel structures on the second source region with a second gate material, the second gate region covering a vertical sidewall of a fifth one of the metal layers of the multilayer stack above the fourth metal layer; and forming a second drain region of the vertical channel structures on the second source and gate regions with the second type channel material, the second drain region covering a vertical sidewall of a sixth one of the metal layers of the multilayer stack above the fifth metal layer.

In an embodiment, the first gate region and the first drain region can be formed by: forming the first gate material on the first source region, the first gate material covering the vertical sidewalls of the second to sixth metal layers and the dielectric layers therebetween; forming the first type channel material on the first source region aligned with the second metal layer; removing a portion of the first gate material higher than the second metal layer such that the first gate region covers the vertical sidewall of the second metal layer; and forming the first drain region with the first type channel material such that the first drain region covers the vertical sidewall of the third metal layer.

In an embodiment, the first source region can cover a portion of the vertical sidewall of the first dielectric layer. In another embodiment, the first source region can cover a portion of a vertical sidewall of a third one of the dielectric layers of the multilayer stack between the first metal layer and the second metal layer.

For example, the first gate material and the second gate material can be the same. As another example, the first epitaxial material and the second epitaxial material can be the same.

In an embodiment, the central portion of the vertical channel structures can be removed by removing a central region of the vertical channel structures along an axis perpendicular to a top surface of the substrate, and removing the first and second epitaxial materials.

Aspects of the present disclosure also provide another method of fabricating a semiconductor device. For example, the method can include forming a multilayer stack on a substrate. In an embodiment, the multilayer stack can include dielectric layers of multiple dielectric materials that are capable of being etched selectively with respect to each other. The method can also include forming at least one opening through the multilayer stack to uncover the substrate and forming at least two vertical channel structures within the opening that are stacked on each other. In an embodiment, the vertical channel structures can have source, gate and drain regions coupled to corresponding ones of the dielectric layers, respectively. The method can also include removing a central portion the vertical channel structures and filling the central portion of the vertical channel structures with a dielectric core. In an embodiment, the vertical channel structures can be isolated from each other and from the substrate by the dielectric core.

For example, the vertical channel structures can be of different channel types.

In an embodiment, the vertical channel structures can be formed by: forming a first epitaxial material on the substrate, the first epitaxial material covering at least a portion of a vertical sidewall of a first one of the dielectric layers of the multilayer stack; forming a first source region of the vertical channel structures on the first epitaxial material with a first type channel material, the first source region covering a vertical sidewall of a second one of the dielectric layers of the multilayer stack above the first dielectric layer; forming a first intrinsic epitaxial material on the first source region, the first intrinsic epitaxial material covering a vertical sidewall of a third one of the dielectric layers of the multilayer stack above the second dielectric layer; forming a first drain region of the vertical channel structures on the first intrinsic epitaxial material, the first drain region covering a vertical sidewall of a fourth one of the dielectric layers of the multilayer stack above the third dielectric layer; forming a second epitaxial material on the first drain region, the second epitaxial material covering a vertical sidewall of a fifth one of the dielectric layers of the multilayer stack above the fourth dielectric layer; forming a second source region of the vertical channel structures on the second epitaxial material with a second type channel material, the second source region covering a vertical sidewall of a sixth one of the dielectric layers of the multilayer stack above the fifth dielectric layer; forming a second intrinsic epitaxial material on the second source region, the second intrinsic epitaxial material covering a vertical sidewall of a seventh one of the dielectric layers of the multilayer stack above the sixth dielectric layer; and forming a second drain region of the vertical channel structures on the second intrinsic epitaxial material, the second drain region covering a vertical sidewall of an eighth one of the dielectric layers of the multilayer stack above the seventh dielectric layer.

In an embodiment, the method can also include: forming an opening to uncover vertical sidewalls of the multilayer stack surrounding the vertical channel structures; removing the third dielectric layer and replacing with a first gate material and a first metal material; and removing the seventh dielectric layer and replacing with a second gate material and a second metal material.

For example, the first gate material and the second gate material can be the same. As another example, the first intrinsic epitaxial material and the second intrinsic epitaxial material can be the same.

In an embodiment, the central portion of the vertical channel structures can be removed by removing a central region of the vertical channel structures along an axis perpendicular to a top surface of the substrate, and removing the first and second intrinsic epitaxial materials.

Aspects of the present disclosure also provide a semiconductor device. For example, the semiconductor device can include a substrate and at least two vertical channel structures formed on the substrate that are stacked on each other. In an embodiment, the vertical channel structures can have a central portion removed. The semiconductor device can also include a dielectric core filling the central portion that isolates the vertical channel structures from each other and from the substrate and a multilayer stack formed on the substrate that surrounds the vertical channel structures. In an embodiment, the multilayer stack can include alternate metal layers and dielectric layers, the metal layers being in contact with source, gate and drain regions of the vertical channel structures, respectively.

For example, the vertical channel structures can be of different channel types.

In an embodiment, the source region of a lower one of the vertical channel structures can cover a vertical sidewall of a lowest one of the metal layers of the multilayer stack. In another embodiment, the source region can further cover a portion of a lowest one of the dielectric layers of the multilayer stack under the lowest metal layer.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein:

FIG. 8 is a cross-sectional view taken along the ling cut 8A-8A' according to some embodiments of the disclosure;

FIG. 20 is a cross-sectional view taken along the ling cut 20A-20A' according to some embodiments of the disclosure.

DETAILED DESCRIPTION

Figure 1:
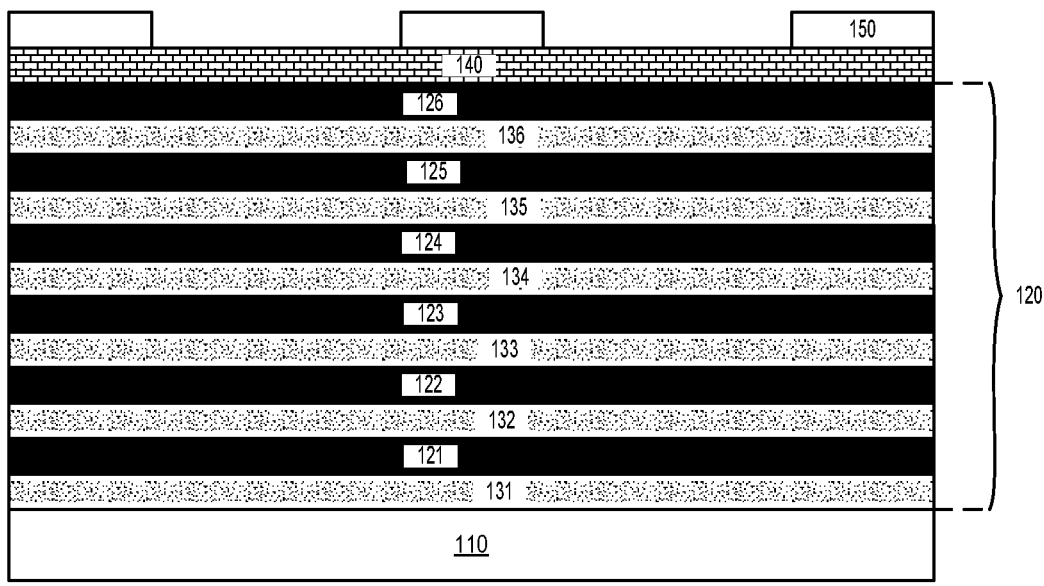
FIG. 1 is a cross-sectional view of an exemplary semiconductor device including a multilayer stack having alternate metal layers and dielectric layers according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

3D integration, i.e. the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array), SoC (System on chip)) is being pursued.

Techniques herein include methods for forming gate-all-around (GAA) transistor structures. Techniques can include forming vertical channel transistors having a dielectric core, and formed through a multilayer stack that includes metal layers for source/drain connections. Thus, exemplary embodiments can include a common or universal 3D stack can enable 3D transistor stacking and self-aligned metal enhancements with the same stack. These structures and techniques provide increased packing density for 3D circuits and devices. There is a speed performance increase due to close proximity and alignment to the adjacent metal connections. Due to oxide core and FD (Floating body) 3D devices, high Ion (on state current) and Low Idoff (off state leakage) is obtained for high performance. Techniques can provide a common pattern to all 3D vertical grown transistors.

Embodiments herein are described with several process flows.

A first process flow (FIGS. 1-8) describes 3D stacked devices with isolation vertical devices including the 3D device core, and substrate device isolation (CFET stack) with 3D metal self-aligned to source, gate and drain regions on any semiconductor substrate. Embodiments can be stacked N devices high. A second process flow (FIGS. 9-20) describes devices stacked with isolation between vertical devices including the device core, and substrate device isolation (CFET stack) with gate electrodes customized to each device type. Embodiments can be stacked N devices high as well. As can be appreciated any combinations of above flows are contemplated as well as variations an options such as side-by-side devices that are identical or of different CMOS types.

FIG. 1 is a cross-sectional view of an exemplary semiconductor device 100 including a multilayer stack having alternate metal layers and dielectric layers according to some embodiments of the disclosure. In an embodiment, the semiconductor device 100 can include a substrate 110, a multilayer stack 120 formed (e.g., deposited) on the substrate 110 and an optional capping layer 140 formed on the multilayer stack 120. For example, the substrate 110 can be a wafer of any semiconductor material, e.g., Si, Ge and SiGe. The capping layer 140 can include a high-k material. The multilayer stack 120 can include alternate metal layers and dielectric layers. For example, the multilayer stack 120 can include first to sixth metal layers 121-126 and first to sixth dielectric layers 131-136 that are alternate with the first to sixth metal layers 121-126. In an embodiment, the first to sixth metal layers 121-126 can provide connections and routing to source, gate and drain regions of at least two vertical channel structures included in the semiconductor device 100 that are stacked on each other. The vertical channel structures can be FET devices in which a current flow travels perpendicular to a top surface of the substrate 110. The vertical channel structures can be of different channel types. A first etch mask 150 can be formed on the capping layer 140 and subsequently patterned using photolithography. The first etch mask 150 can be used to create openings in the multilayer stack 120 via, for example, etching, for future vertical channel structures to be formed (e.g., epitaxially grown) within. Materials for the first etch mask 150 can be organic or inorganic. Examples of organic materials for the first etch mask 150 can include amorphous carbon or organo siloxane-based materials with reflection control properties, among others. The organic first etch mask 150 can be formed by chemical vapor deposition (CVD) or spin-on processes. Examples of inorganic materials for the first etch mask 150 can include SiN, SiON or TiN, among others. The inorganic first etch mask 150 can be deposited through CVD process.

Figure 2:
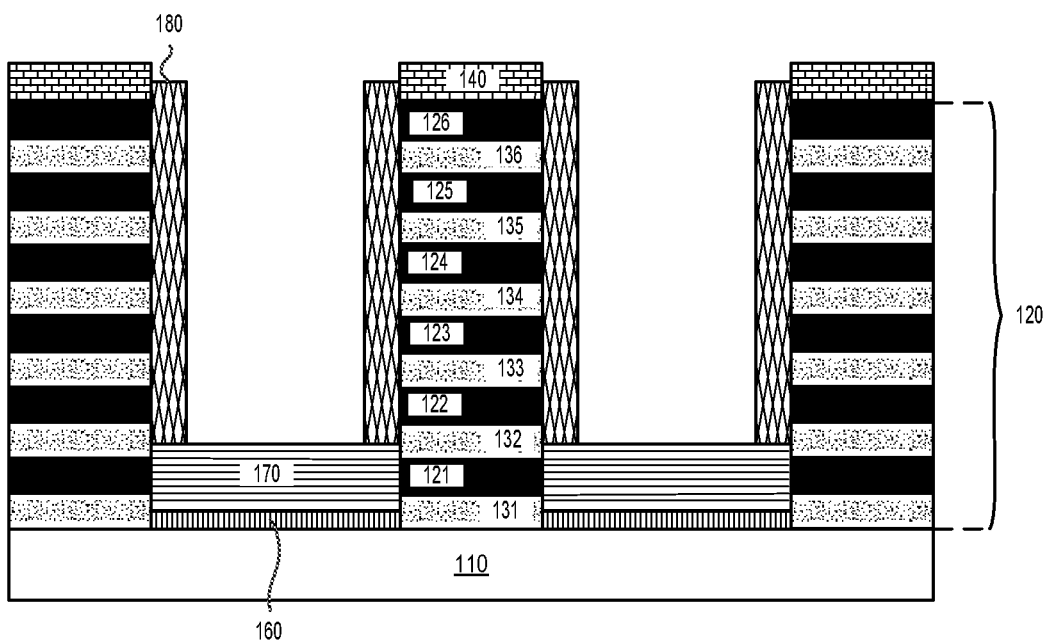
FIG. 2 is a cross-sectional view illustrating etching of a multilayer stack of the exemplary semiconductor device according to some embodiments of the disclosure.

FIG. 2 is a cross-sectional view illustrating etching of the multilayer stack 120 of the exemplary semiconductor device 100 according to some embodiments of the disclosure. An etching process can be performed and a portion of the multilayer stack 120 that is not protected by the first etch mask 150 can be etched to form at least one opening through the multilayer stack 120 until uncovering the top surface of the substrate 110, for the vertical channel structures to be formed within. The first etch mask 150 can be removed and the multilayer stack 120 can be cleaned. A first (sacrificial) epitaxial material 160 can be formed (e.g., epitaxially grown) on the substrate 110. In an embodiment, the first epitaxial material 160 can be aligned with the first dielectric layer 131 of the multilayer stack 120. In another embodiment, the first epitaxial material 160 can cover at least a portion of a vertical sidewall of the first dielectric layer 131 of the multilayer stack 120. The first epitaxial material 160 can be, for example, Si or SiGe, among others. A first source region 170 of the vertical channel structures can be formed (e.g., epitaxially grown) on the first epitaxial material 160 with a first type channel material, e.g., a P type epitaxial material. In an embodiment, the first source region 170 can cover a vertical sidewall of the first metal layer 121 of the multilayer stack 120 above the first dielectric layer 131. In another embodiment, the first source region 170 can further cover a portion of the vertical sidewall of the first dielectric layer 131. In yet another embodiment, the first source region 170 can also cover a portion of a vertical sidewall of the second dielectric layer 132, which is between the first metal layer 121 and the second metal layer 122. A first gate region 180 can be formed (e.g., deposited) on the first source region 170 with a first gate material, e.g., a first high-k material. In an embodiment, the first gate region 180 can cover the vertical sidewalls of the second metal layer 122 to the sixth metal layer 126.

Figure 3:
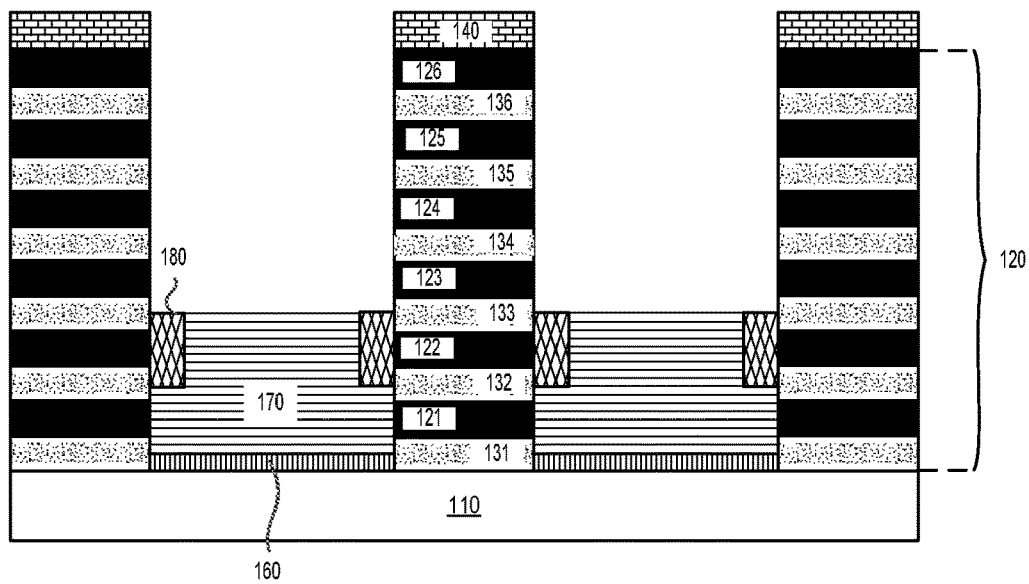
FIG. 3 is a cross-sectional view illustrating formation of a first gate region of vertical channel structures of the exemplary semiconductor device according to some embodiments of the disclosure.

FIG. 3 is a cross-sectional view illustrating formation of the first gate region 180 of the vertical channel structures of the exemplary semiconductor device 100 according to some embodiments of the disclosure. The P type epitaxial material growth can be continued until being aligned with or higher than the second metal layer 122. A portion of the first high-k material 180 that is higher than the second metal layer 122 can then be removed (e.g., via etching). In an embodiment, the first gate region 180 thus formed can cover the vertical sidewall of the second metal layer 122. In another embodiment, the first gate region 180 can further cover a portion of the third dielectric layer 133, as shown in FIG. 3.

Figure 4:
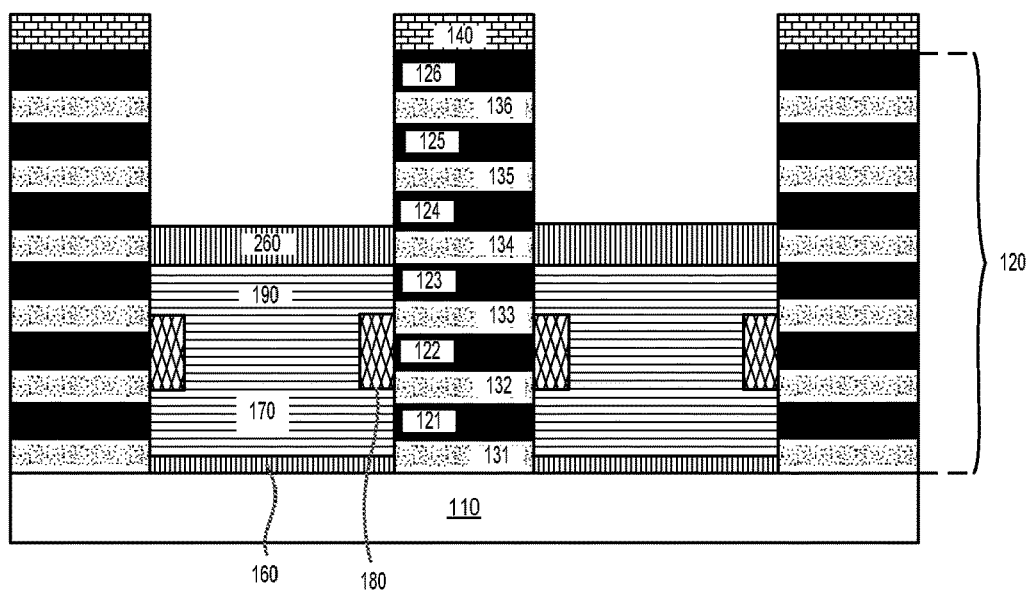
FIG. 4 is a cross-sectional view illustrating formation of a first drain region of the vertical channel structures of the exemplary semiconductor device according to some embodiments of the disclosure.

FIG. 4 is a cross-sectional view illustrating formation of a first drain region 190 of the vertical channel structures of the exemplary semiconductor device 100 according to some embodiments of the disclosure. The P type epitaxial material growth can be continued until being aligned with or higher than the third metal layer 123 to form the first drain region 190 of the vertical channel structures of the semiconductor device 100. In an embodiment, the first drain region 190 can cover the vertical sidewall of the third metal layer 123. In another embodiment, the first drain region 190 can further cover a portion of the vertical sidewall of the third dielectric layer 133. In yet another embodiment, the first drain region 190 can also cover a portion of the vertical sidewall of the fourth dielectric layer 134. A second epitaxial (sacrificial, transitional) material 260 can be formed (e.g., epitaxially grown) on the first drain region 190. In an embodiment, the second epitaxial material 260 can be aligned with the fourth dielectric layer 134 of the multilayer stack 120. In another embodiment, the second epitaxial material 260 can cover only a portion of the vertical sidewall of the fourth dielectric layer 134 of the multilayer stack 120. In yet another embodiment, the second epitaxial material 260 can further cover a portion of the fourth metal layer 124 of the multilayer stack 120, as shown in FIG. 4. The second epitaxial material 260 can be, for example, Si or SiGe, among others. In an embodiment, the second epitaxial material 260 and the first epitaxial material 160 can be the same. In another embodiment, the second epitaxial material 260 and the first epitaxial material 160 can be different.

Figure 5:
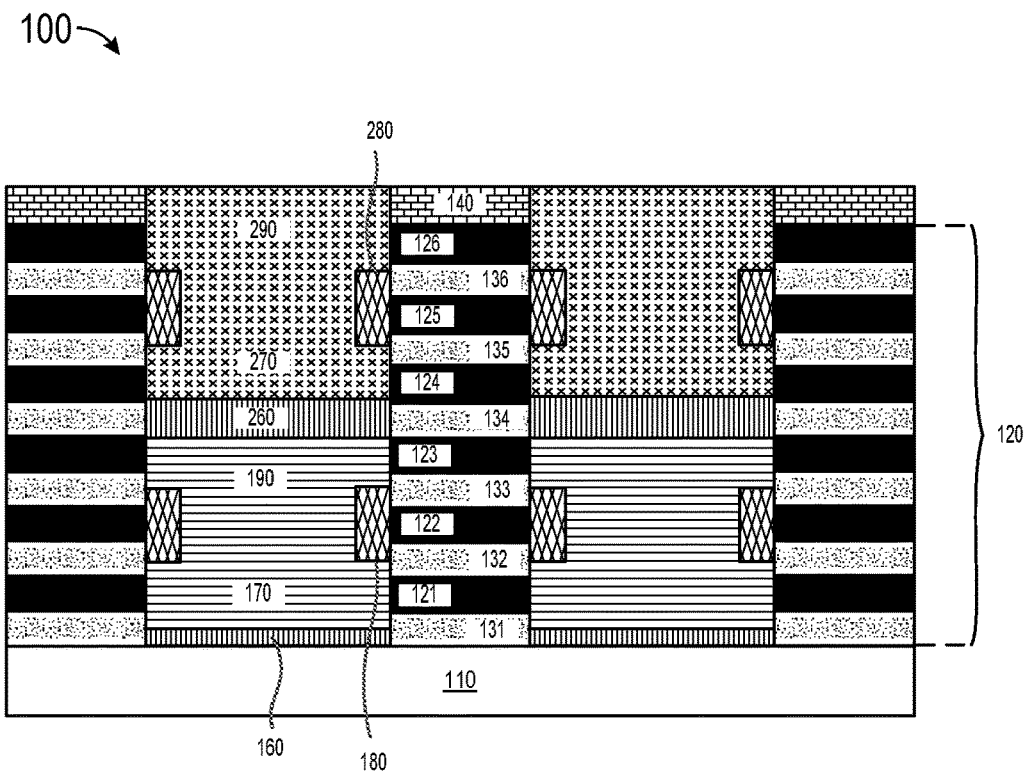
FIG. 5 is a cross-sectional view illustrating formation of second source, gate and drain regions of the vertical channel structures of the exemplary semiconductor device according to some embodiments of the disclosure.

FIG. 5 is a cross-sectional view illustrating formation of second source, gate and drain regions of the vertical channel structures of the exemplary semiconductor device 100 according to some embodiments of the disclosure. Similar to the processes shown in FIGS. 3 and 4, a second source region 270 of the vertical channel structures can be formed (e.g., epitaxially grown) on the second epitaxial material 260 with a second type channel material, e.g., an N type epitaxial material, which is different from the first type channel material. In an embodiment, the second source region 270 can cover the vertical sidewall of the fourth metal layer 124 of the multilayer stack 120 above the fourth dielectric layer 134. In another embodiment, the second source region 270 can further cover a portion of the vertical sidewall of the fourth dielectric layer 134. In yet another embodiment, the second source region 270 can also cover a portion of a vertical sidewall of the fifth dielectric layer 135, which is between the fourth metal layer 124 and the fifth metal layer 125. A second gate region 280 can be formed (e.g., deposited) on the second source region 270 with a second gate material, e.g., a second high-k material. For example, the second high-k material and the first high-k material can be the same. As another example, the second high-k material and the first high-k material can be different. In an embodiment, the second gate region 280 can cover the vertical sidewall of the fifth metal layer 125. In another embodiment, the second gate region 280 can further cover a portion of the sixth dielectric layer 136, as shown in FIG. 5. The N type epitaxial material growth can be continued until being aligned with the capping layer 140 to form a second drain region 290 of the vertical channel structures of the semiconductor device 100. In an embodiment, the second drain region 290 can cover the vertical sidewall of the sixth metal layer 126. In another embodiment, the second drain region 290 can further cover a portion of the vertical sidewall of the sixth dielectric layer 136.

Figure 6:
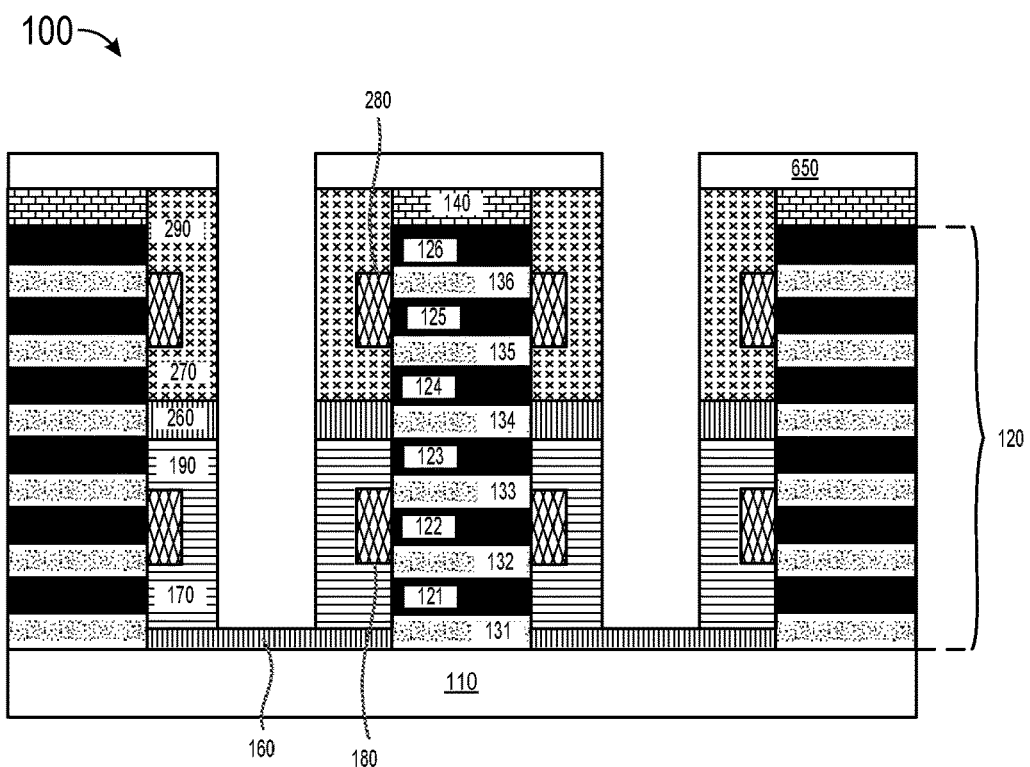
FIG. 6 is a cross-sectional view illustrating etching of the vertical channel structures of the exemplary semiconductor device according to some embodiments of the disclosure.

FIG. 6 is a cross-sectional view illustrating etching of the vertical channel structures of the exemplary semiconductor device 100 according to some embodiments of the disclosure. A second etch mask 650 can be formed on the capping layer 140 and the vertical channel structures and subsequently patterned using photolithography. The second etch mask 650 can be used to create a vertical opening in the vertical channel structures via, for example, etching, for future isolation dielectric core to be formed within. Materials for the second etch mask 650 can be organic or inorganic. Examples of organic materials for the second etch mask 650 can include amorphous carbon or organo siloxane-based materials with reflection control properties, among others. The organic second etch mask 650 can be formed by CVD or spin-on processes. Examples of inorganic materials for the second etch mask 650 can include SiN, SiON or TiN, among others. The inorganic second etch mask 650 can be deposited through CVD process. For example, the second etch mask 650 and the first etch mask 150 can be the same. As another example, the second etch mask 650 and the first etch mask 150 can be different. An etching process can be performed and a central region of the vertical channel structures that is not protected by the second etch mask 650 can be etched to form the vertical opening within the vertical channel structures down to the first epitaxial material 160. In an embodiment, the vertical opening does not uncover the first and second gate regions 180 and 208. Basically, the vertical channel structures can thus be hollowed.

Figure 7:
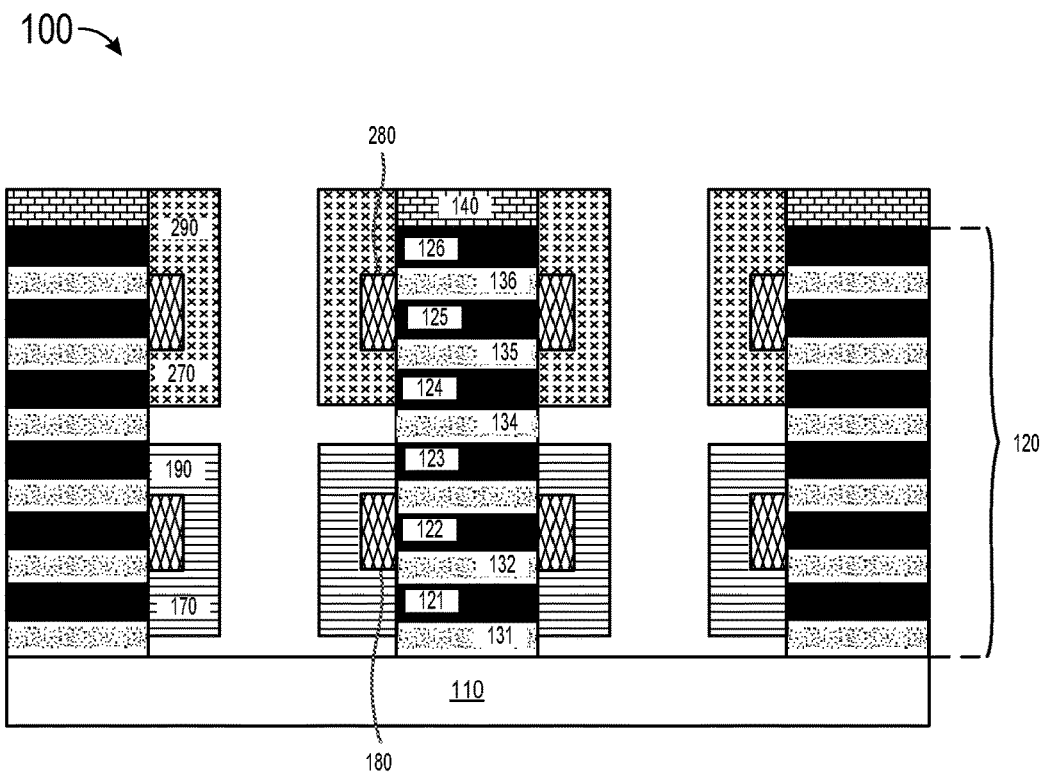
FIG. 7 is a cross-sectional view illustrating removal of a first epitaxial material and a second epitaxial material of the exemplary semiconductor device according to some embodiments of the disclosure.

FIG. 7 is a cross-sectional view illustrating removal of the first epitaxial material 160 and the second epitaxial material 260 of the exemplary semiconductor device 100 according to some embodiments of the disclosure. The central region of the vertical channel structures and the first epitaxial material 160 and the second epitaxial material 260 can be referred to as a central portion of the vertical channel structures. The first epitaxial material 160 and the second epitaxial material 260 can be removed (e.g., via etching). The second etch mask 650 can be removed and the vertical channel structures can be cleaned.

Figure 8:
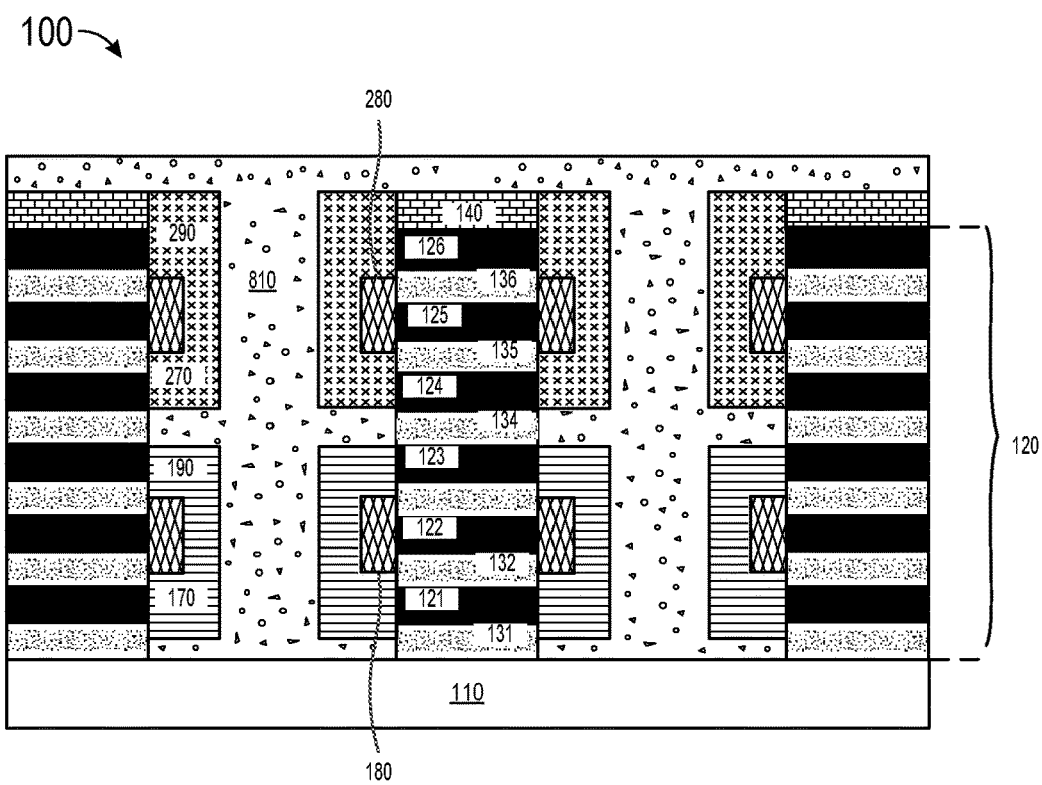
FIG. 8 is a cross-sectional view illustrating filling of the central portion with a dielectric core of the exemplary semiconductor device according to some embodiments of the disclosure.

FIG. 8 is a cross-sectional view illustrating filling of the central portion with a dielectric core 810 of the exemplary semiconductor device 100 according to some embodiments of the disclosure. The vertical opening and the vacancy formed after removal of the first epitaxial material 160 and the second epitaxial material 260 can be filled with the dielectric core 810. The dielectric core 810 can thus isolate the vertical channel structures from each other and from the substrate 110. Therefore, the semiconductor wafer 110 can be isolated from the PMOS and NMOS devices and the PMOS and NMOS devices can be isolated from each other.

Figure 8A:
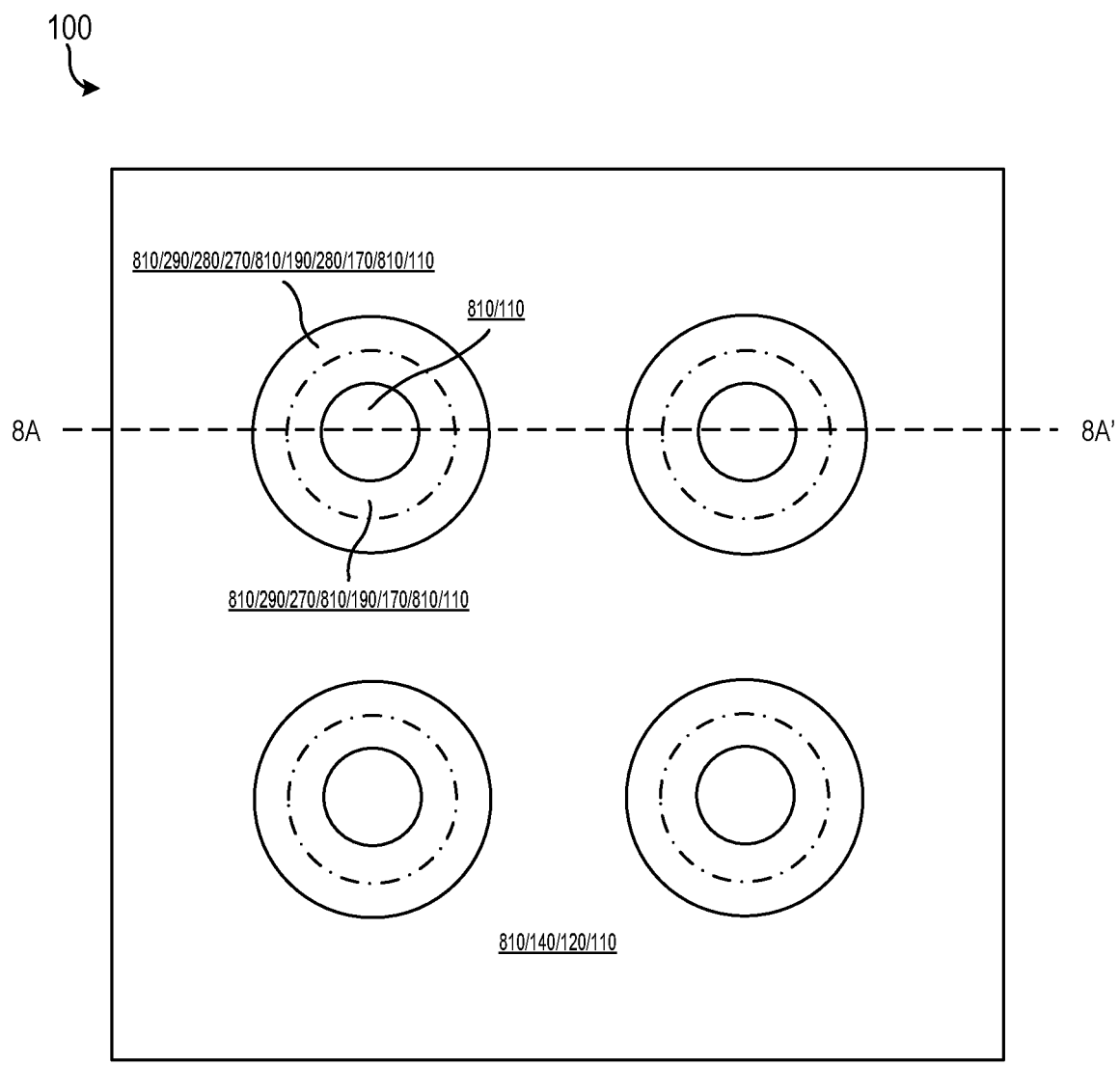
FIG. 8A is a top-down view of the exemplary semiconductor device in FIG. 8 where

FIG. 8A is a top-down view of the exemplary semiconductor device 100 in FIG. 8 where FIG. 8 is a cross-sectional view taken along the ling cut 8A-8A' according to some embodiments of the disclosure. While the exemplary semiconductor device 100 is shown to have four separate sets of vertical channel structures in a 2×2 array, it is understood that the exemplary semiconductor device 100 can typically include more than four separate sets of vertical channel structures in any kind of array.

The second process flow describes devices stacked with isolation between vertical devices including the device core, and substrate device isolation (CFET stack) with gate electrodes customized to each device type.

Figure 9:
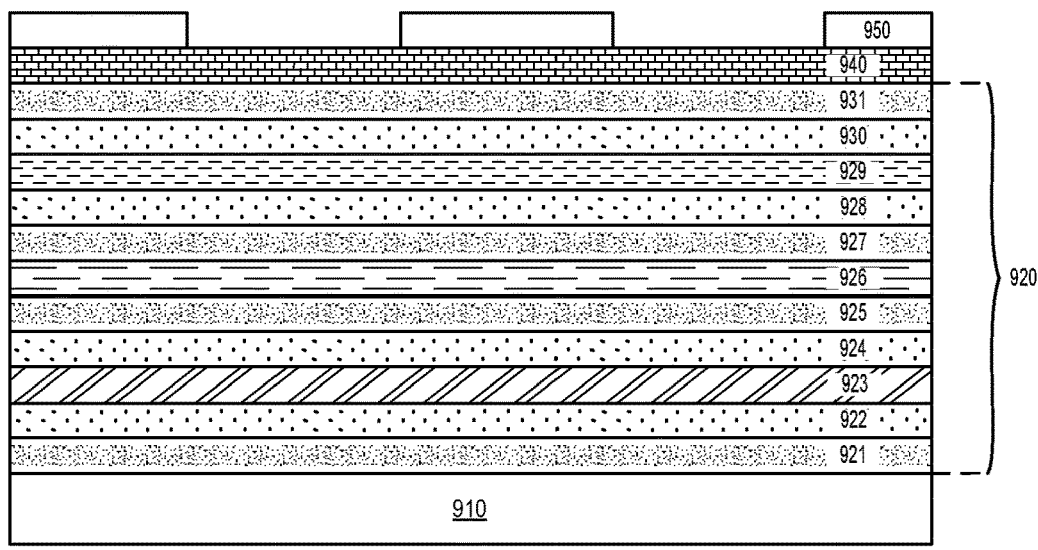
FIG. 9 is a cross-sectional view of another exemplary semiconductor device including a multilayer stack having dielectric layers according to some embodiments of the disclosure.

FIG. 9 is a cross-sectional view of an exemplary semiconductor device 900 including a multilayer stack having dielectric layers according to some embodiments of the disclosure. In an embodiment, the semiconductor device 900 can include a substrate 910, a multilayer stack 920 formed (e.g., deposited) on the substrate 910 and an optional capping layer 940 formed on the multilayer stack 920. For example, the substrate 910 can be a wafer of any semiconductor material, e.g., Si, Ge and SiGe. The capping layer 940 can include a high-k material. The multilayer stack 920 can include first to eleventh dielectric layers 921-931. In an embodiment, the first to eleventh dielectric layer 921-931 are of multiple dielectric materials that are capable of being etched selectively with respect to each other. That is, any predetermined dielectric of the dielectric materials can be etched without substantially etching the remaining dielectric materials. For example, the first dielectric layer 921 and the fifth dielectric layer 925 can be chosen to have selectivity to a predetermined etchant while the second dielectric layer 922, the third dielectric layer 923 and the fourth dielectric layer 924 are not selective to the predetermined etchant. It may be appreciated by those in the art that material etch selectivities are generally known. In an embodiment, the first, fifth, seventh and eleventh dielectric layers 921, 925, 927 and 931, the second, fourth, eighth and tenth dielectric layers 922, 924, 928 and 930, the third dielectric layer 923, the sixth dielectric layer 926, and the ninth dielectric layer 929 are of five different dielectric materials that can be etched selectively with respect to each other. A first etch mask 950 can be formed on the capping layer 940 and subsequently patterned using photolithography. The first etch mask 950 can be used to create openings in the multilayer stack 920 via, for example, etching, for future vertical channel structures to be formed (e.g., epitaxially grown) within. Materials for the first etch mask 950 can be organic or inorganic. Examples of organic materials for the first etch mask 950 can include amorphous carbon or organo siloxane-based materials with reflection control properties, among others. The organic first etch mask 950 can be formed by chemical vapor deposition (CVD) or spin-on processes. Examples of inorganic materials for the first etch mask 950 can include SiN, SiON or TiN, among others. The inorganic first etch mask 950 can be deposited through CVD process.

Figure 10:
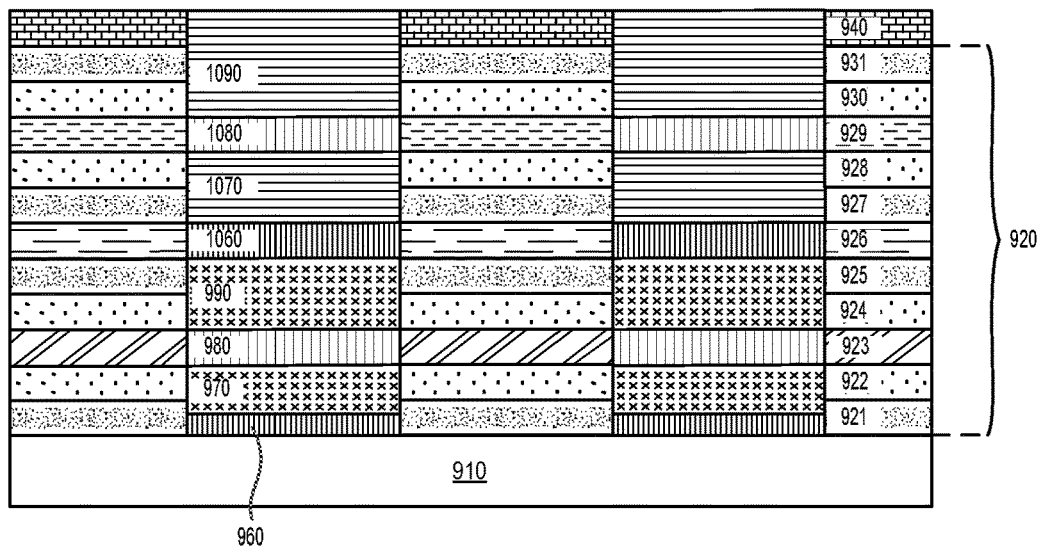
FIG. 10 is a cross-sectional view illustrating etching of the multilayer stack to form at least one opening and formation of at least two vertical channel structures within the opening of the exemplary semiconductor device according to some embodiments of the disclosure.

FIG. 10 is a cross-sectional view illustrating etching of the multilayer stack 920 to form at least one opening and formation of at least two vertical channel structures within the opening of the exemplary semiconductor device 900 according to some embodiments of the disclosure. For example, the vertical channel structures can be of different channel types. An etching process can be performed and a portion of the multilayer stack 920 that is not protected by the first etch mask 950 can be etched to form at least one opening through the multilayer stack 920 until uncovering a top surface of the substrate 910, for the vertical channel structures to be formed within. The first etch mask 950 can be removed and the multilayer stack 920 can be cleaned. A first (sacrificial) epitaxial material 960 can be formed (e.g., epitaxially grown) on the substrate 910. In an embodiment, the first epitaxial material 960 can be aligned with the first dielectric layer 921 of the multilayer stack 920. In another embodiment, the first epitaxial material 960 can cover at least a portion of a vertical sidewall of the first dielectric layer 921 of the multilayer stack 920. The first epitaxial material 960 can be, for example, Si or SiGe, among others.

A first source region 970 of the vertical channel structures can be formed (e.g., epitaxially grown) on the first epitaxial material 960 with a first type channel material, e.g., an N type epitaxial material. In an embodiment, the first source region 970 can cover a vertical sidewall of the second dielectric layer 922 of the multilayer stack 920 above the first dielectric layer 921. A first intrinsic epitaxial material 980 can be formed (e.g., deposited) on the first source region 970. In an embodiment, the first intrinsic epitaxial material 980 can cover the vertical sidewall of the third dielectric layer 923 of the multilayer stack 920 above the second dielectric layer 922. A first drain region 990 of the vertical channel structures can be formed (e.g., epitaxially grown) on the first intrinsic epitaxial material 980 with the first type channel material, e.g., an N type epitaxial material. In an embodiment, the first drain region 990 can cover vertical sidewalls of the fourth and fifth dielectric layers 924 and 925.

A second (sacrificial, transitional) epitaxial material 1060 can be formed (e.g., epitaxially grown) on the first drain region 990. In an embodiment, the second epitaxial material 1060 can be aligned with the sixth dielectric layer 926 of the multilayer stack 920. In another embodiment, the second epitaxial material 1060 can cover a vertical sidewall of the sixth dielectric layer 926 of the multilayer stack 920. The second epitaxial material 1060 can be, for example, Si or SiGe, among others. In an embodiment, the second epitaxial material 1060 and the first epitaxial material 960 can be the same. In another embodiment, the second epitaxial material 1060 and the first epitaxial material 960 can be different.

A second source region 1070 of the vertical channel structures can be formed (e.g., epitaxially grown) on the second epitaxial material 1060 with a second type channel material, e.g., a P type epitaxial material, which is different from the first type channel material. In an embodiment, the second source region 1070 can cover vertical sidewalls of the seventh and eighth dielectric layers 927 and 928 of the multilayer stack 920. A second intrinsic epitaxial material 1080 can be formed (e.g., deposited) on the second source region 1070. For example, the second intrinsic epitaxial material 1080 and the first intrinsic epitaxial material 980 can be the same. As another example, the second intrinsic epitaxial material 1080 and the first intrinsic epitaxial material 980 can be different. In an embodiment, the second intrinsic epitaxial material 1080 can cover a vertical sidewall of the ninth dielectric layer 929. A second drain region 1090 of the vertical channel structures can be formed (e.g., epitaxially grown) on the second intrinsic epitaxial material 1080 with the second type channel material, e.g., a P type epitaxial material. In an embodiment, the second drain region 1090 can cover vertical sidewalls of the tenth and eleventh dielectric layers 930 and 931 and of the capping layer 940 as well.

Figure 11:
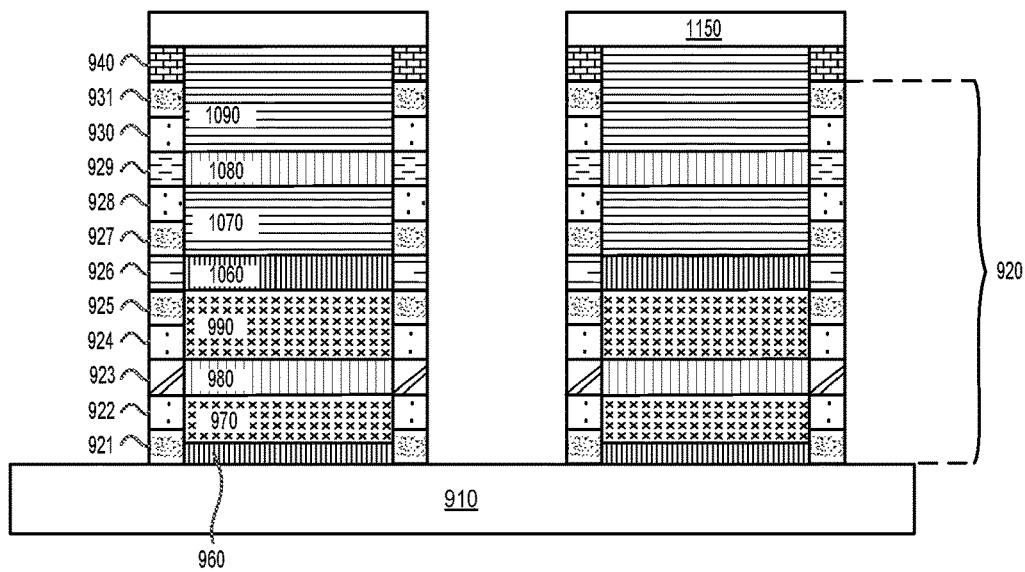
FIG. 11 is a cross-sectional view illustrating etching of the vertical channel structures of the exemplary semiconductor device according to some embodiments of the disclosure.

FIG. 11 is a cross-sectional view illustrating etching of the vertical channel structures of the exemplary semiconductor device 900 according to some embodiments of the disclosure. A second etch mask 1150 can be formed on the capping layer 940 and the vertical channel structures and subsequently patterned using photolithography. The second etch mask 1150 can be used to create a vertical opening in the vertical channel structures via, for example, etching. Materials for the second etch mask 1150 can be organic or inorganic. Examples of organic materials for the second etch mask 1150 can include amorphous carbon or organo siloxane-based materials with reflection control properties, among others. The organic second etch mask 1150 can be formed by CVD or spin-on processes. Examples of inorganic materials for the second etch mask 1150 can include SiN, SiON or TiN, among others. The inorganic second etch mask 1150 can be deposited through CVD process. For example, the second etch mask 1150 and the first etch mask 950 can be the same. As another example, the second etch mask 1150 and the first etch mask 950 can be different. An etching process can be performed and openings are formed that uncover vertical sidewalls of the multilayer stack 920.

Figure 12:
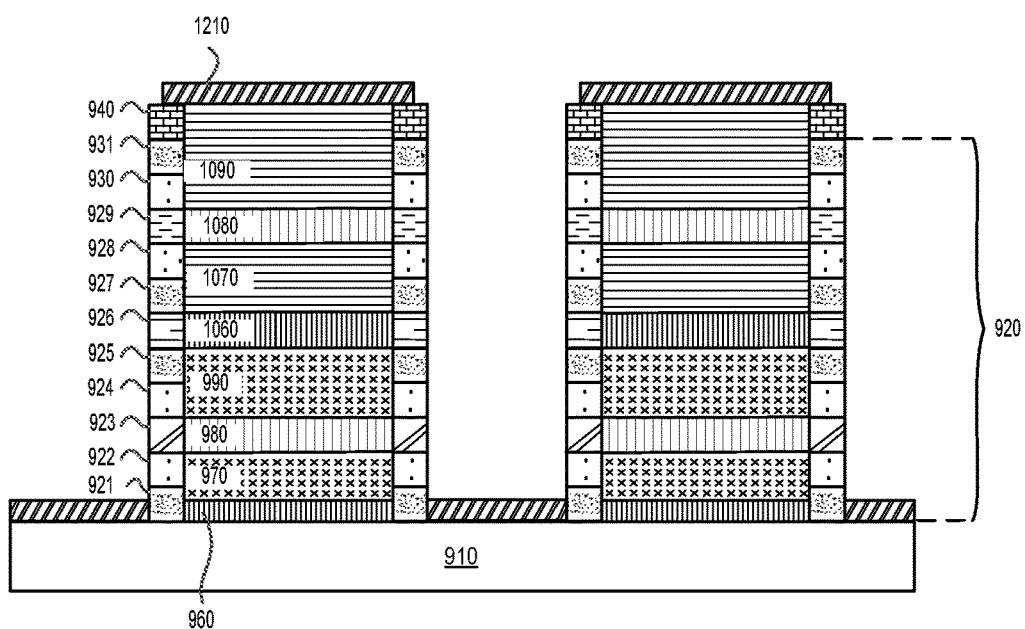
FIG. 12 is a cross-sectional view illustrating formation of a dielectric material of the exemplary semiconductor device according to some embodiments of the disclosure.

FIG. 12 is a cross-sectional view illustrating formation of a dielectric material on the substrate 910 within the openings as well as on the capping layer 940 and the second drain region 1090 of the exemplary semiconductor device 900 according to some embodiments of the disclosure. The second etch mask 1150 can be removed and the multilayer stack 920 can be cleaned. An optional dielectric material 1210 can be formed (e.g., deposited or grown) on the substrate 910 within the openings as well as on the capping layer 940 and top surfaces of the vertical channel structures.

Figure 13:
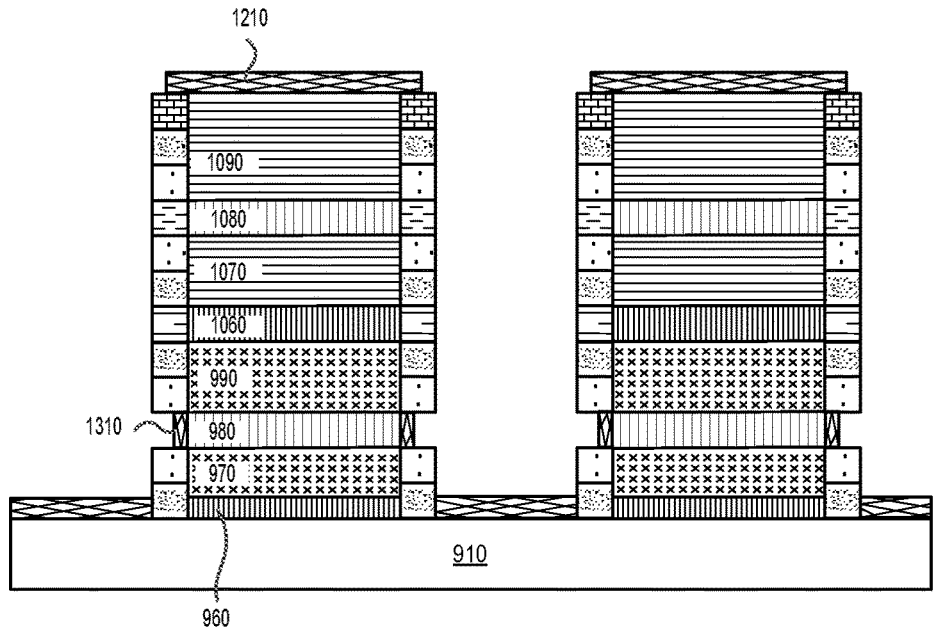
FIGS. 13 and 14 are cross-sectional views illustrating formation of a first gate region of the vertical channel structures of the exemplary semiconductor device according to some embodiments of the disclosure.
Figure 14:
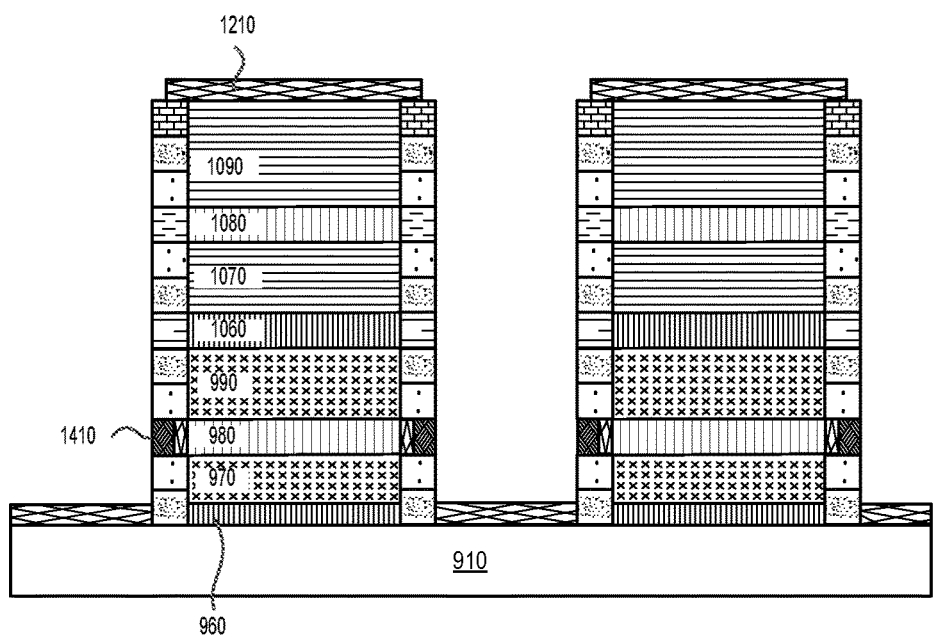

FIGS. 13 and 14 are cross-sectional views illustrating formation of a first gate region of the vertical channel structures of the exemplary semiconductor device 900 according to some embodiments of the disclosure. As shown in FIG. 13, the third dielectric layer 923 that is covered by the first intrinsic epitaxial material 980 can be etched and removed. For example, the third dielectric layer 923 can be etched by isotropic etching such as vapor-phase etching. As the third dielectric layer 923 can be etched selectively with respect to the first, second and fourth to eleventh dielectric layers 921, 922 and 924-931, when the third dielectric layer 923 is etched, the first, second and fourth to eleventh dielectric layers 921, 922 and 924-931 will not be etched or substantially etched. As also shown in FIG. 13, the third dielectric layer 923 can be replaced with a first gate material 1310. In an embodiment, the first gate material 1310 can be a high-k dielectric material. As shown in FIG. 14, a first metal material 1410 can be formed (e.g., deposited) on the first gate material 1310. For example, the first metal material 1410 can be work function metal (WFM). The first metal material 1410 and the first gate material 1310 can be referred to as the first gate region of the vertical channel structures of the exemplary semiconductor device 900.

Figure 15:
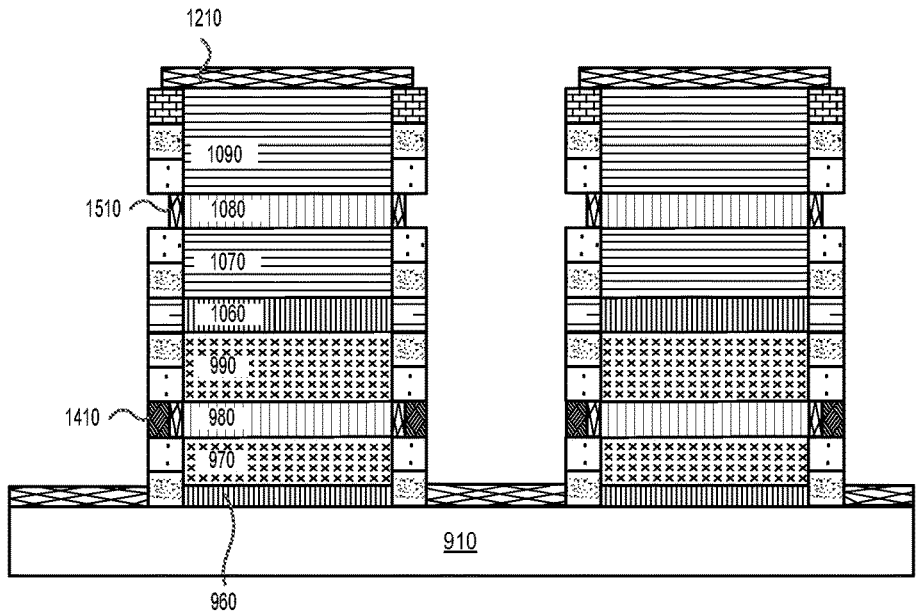
FIGS. 15 and 16 are cross-sectional views illustrating formation of a second gate region of the vertical channel structures of the exemplary semiconductor device according to some embodiments of the disclosure.
Figure 16:
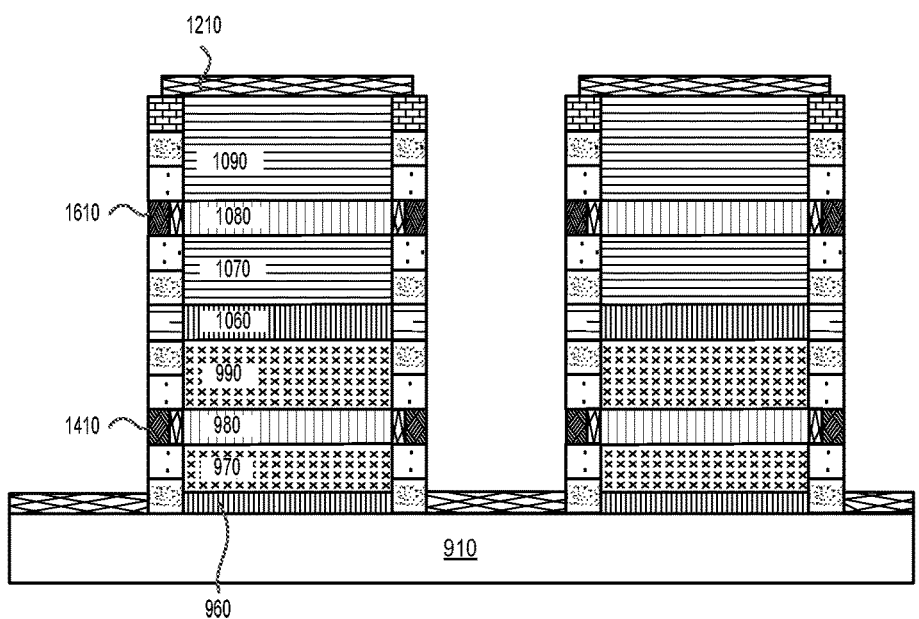

FIGS. 15 and 16 are cross-sectional views illustrating formation of a second gate region of the vertical channel structures of the exemplary semiconductor device 900 according to some embodiments of the disclosure. As shown in FIG. 15, the ninth dielectric layer 929 that is covered by the second intrinsic epitaxial material 1080 can be etched and removed. For example, the ninth dielectric layer 929 can be etched by isotropic etching such as vapor-phase etching.

As the ninth dielectric layer 929 can be etched selectively with respect to the first, second, fourth to eighth, tenth and eleventh dielectric layers 921, 922, 924-928, 930 and 931, when the ninth dielectric layer 929 is etched, the first, second, fourth to eighth, tenth and eleventh dielectric layers 921, 922, 924-928, 930 and 931 will not be etched or substantially etched. As also shown in FIG. 15, the ninth dielectric layer 929 can be replaced with a second gate material 1510. In an embodiment, the second gate material 1510 can be a high-k dielectric material. For example, the first gate material 1310 and the second gate material 1510 can be the same. As another example, the first gate material 1310 and the second gate material 1510 can be different. As shown in FIG. 16, a second metal material 1610 can be formed (e.g., deposited) on the second gate material 1510. The second metal material 1610 and the second gate material 1510 can be referred to as the second gate region of the vertical channel structures of the exemplary semiconductor device 900.

Figure 17:
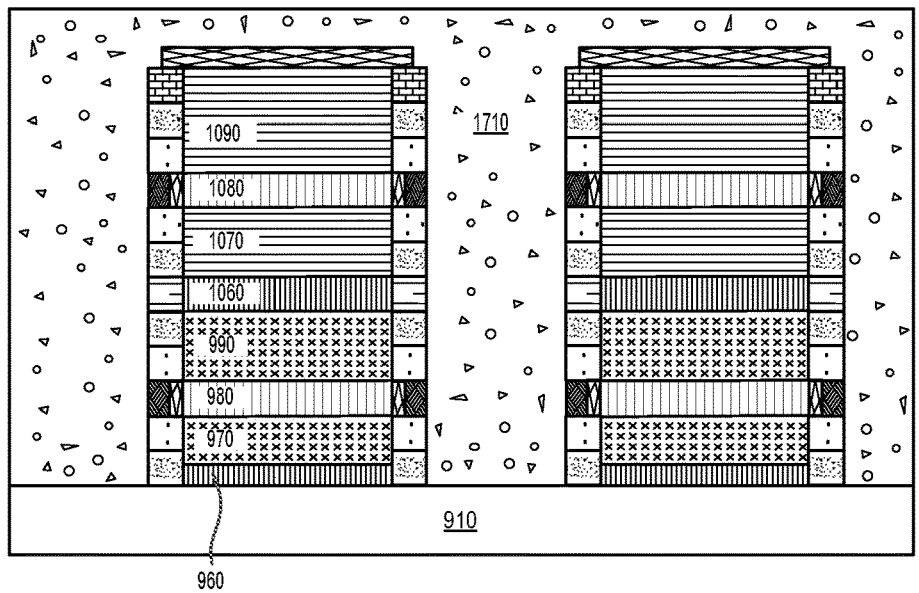
FIG. 17 is a cross-sectional views illustrating covering of the vertical channel structures of the exemplary semiconductor device according to some embodiments of the disclosure.

FIG. 17 is a cross-sectional views illustrating covering of the vertical channel structures of the exemplary semiconductor device 900 according to some embodiments of the disclosure. The dielectric material 1210 formed on the substrate 910 can be removed via, for example, etching. A dielectric material 1710 can then be formed (e.g., deposited) on and cover the substrate 910 and the vertical channel structures and be planarized.

Figure 18:
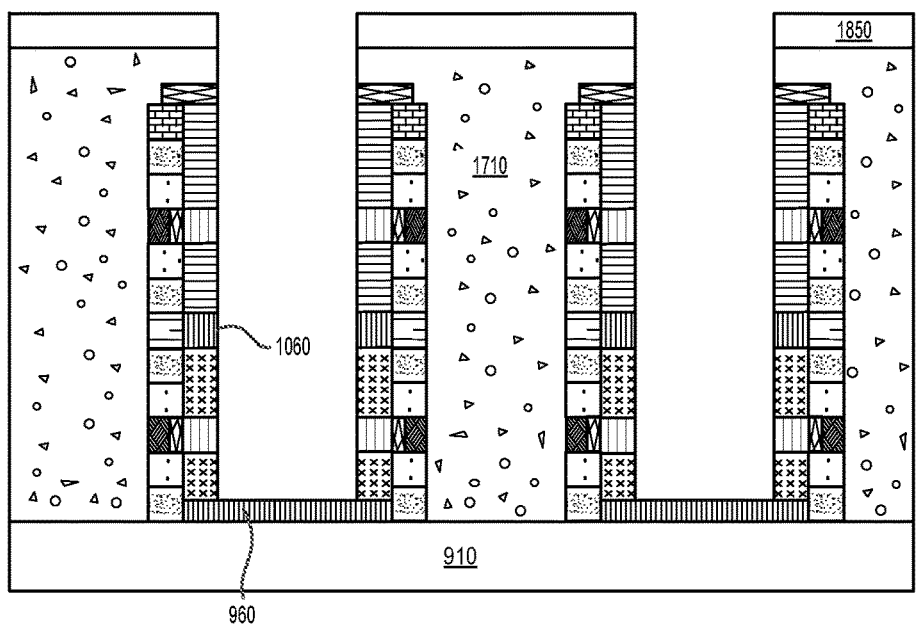
FIG. 18 is a cross-sectional view illustrating etching of the vertical channel structures of the exemplary semiconductor device according to some embodiments of the disclosure.

FIG. 18 is a cross-sectional view illustrating etching of the vertical channel structures of the exemplary semiconductor device 900 according to some embodiments of the disclosure. A third etch mask 1850 can be formed on the dielectric material 1710 and subsequently patterned using photolithography. The third etch mask 1850 can be used to create a vertical opening in the vertical channel structures via, for example, etching, for future isolation dielectric core to be formed within. Materials for the third etch mask 1850 can be organic or inorganic. Examples of organic materials for the third etch mask 1850 can include amorphous carbon or organo siloxane-based materials with reflection control properties, among others. The organic second etch mask 1850 can be formed by CVD or spin-on processes. An etching process can be performed and a central region of the vertical channel structures that is not protected by the third etch mask 1850 can be etched to form the vertical opening within the vertical channel structures down to the first epitaxial material 960. Basically, the vertical channel structures can thus be hollowed.

Figure 19:
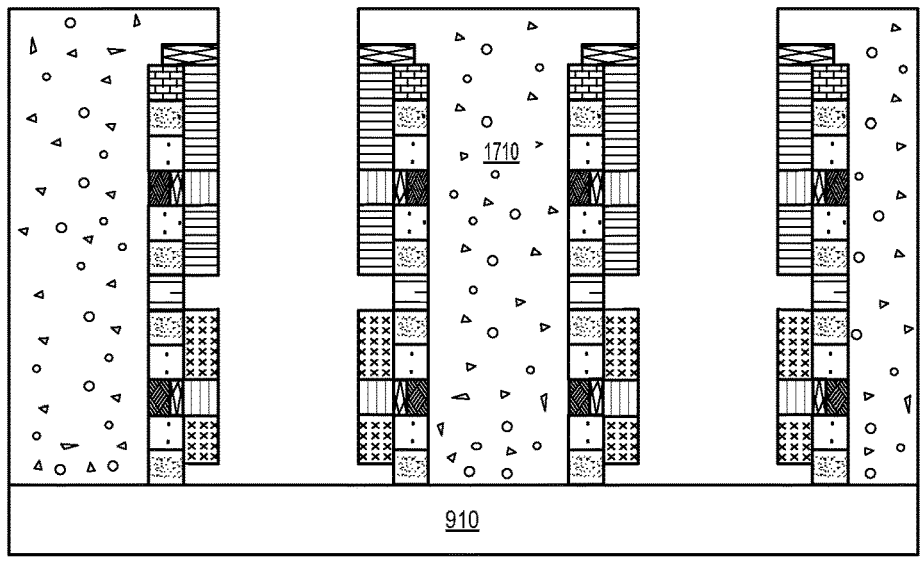
FIG. 19 is a cross-sectional view illustrating removal of a first epitaxial material and a second epitaxial material of the exemplary semiconductor device according to some embodiments of the disclosure.

FIG. 19 is a cross-sectional view illustrating removal of the first epitaxial material 960 and the second epitaxial material 1060 of the exemplary semiconductor device 900 according to some embodiments of the disclosure. The central region of the vertical channel structures and the first epitaxial material 960 and the second epitaxial material 1060 can be referred to as a central portion of the vertical channel structures. The first epitaxial material 960 and the second epitaxial material 1060 can be removed (e.g., via etching). The third etch mask 1850 can be removed and the vertical channel structures can be cleaned.

Figure 20:
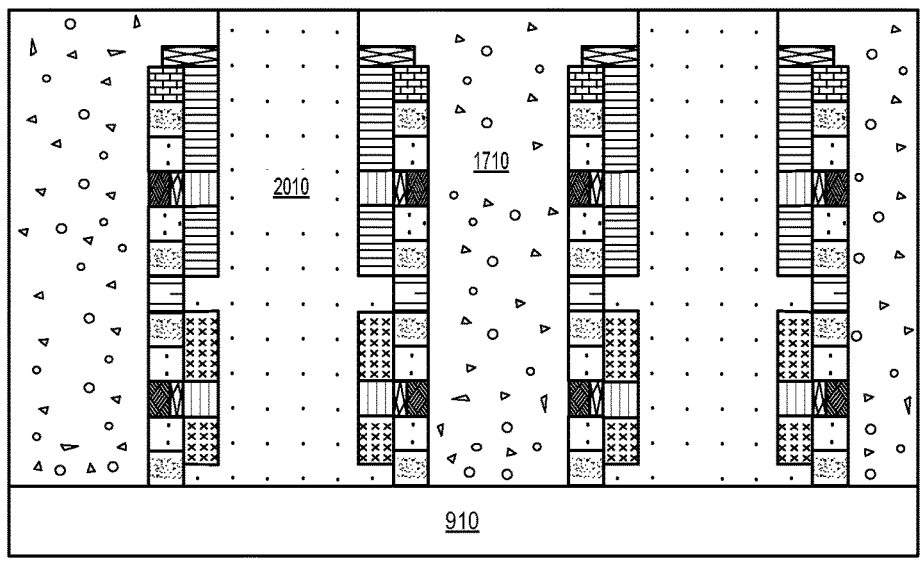
FIG. 20 is a cross-sectional view illustrating filling of a central portion with a dielectric core of the exemplary semiconductor device according to some embodiments of the disclosure.

FIG. 20 is a cross-sectional view illustrating filling of the central portion with a dielectric core 2010 of the exemplary semiconductor device 900 according to some embodiments of the disclosure. The vertical opening and the vacancy formed after removal of the first epitaxial material 960 and the second epitaxial material 960 can be filled with a dielectric core 2010. The dielectric core 2010 can thus isolate the vertical channel structures from each other and from the substrate 910. Therefore, the semiconductor wafer 910 can be isolated from the PMOS and NMOS devices and the PMOS and NMOS devices can be isolated from each other. As the channel region of the vertical channel structures is short, a large number of N height vertical channels can be stacked on top of each other. Processing can then continue with electrical connections to source, gate and drain regions of the PMOS and NMOS devices.

Figure 20A:
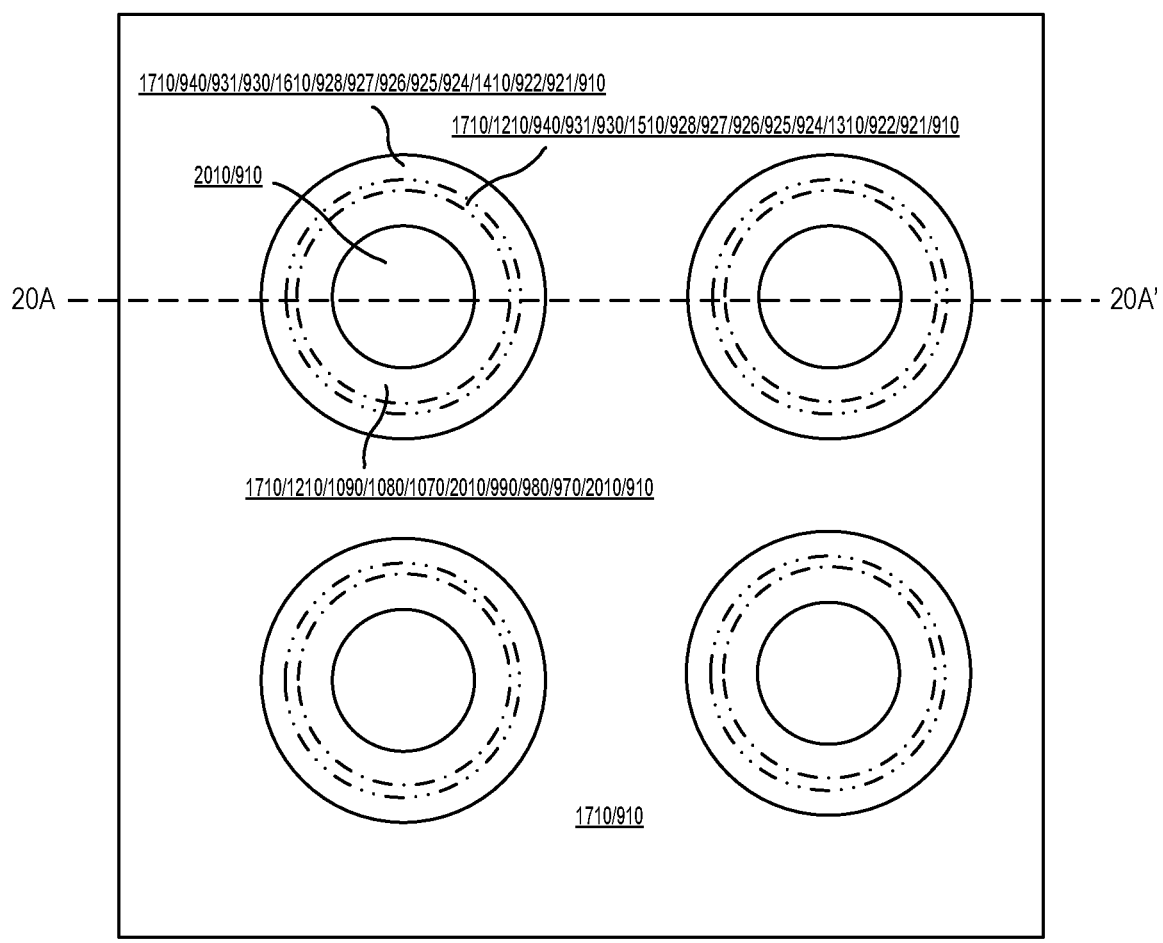
FIG. 20A is a top-down view of the exemplary semiconductor device in FIG. 20 where

FIG. 20A is a top-down view of the exemplary semiconductor device 900 in FIG. 20 where FIG. 20 is a cross-sectional view taken along the ling cut 20A-20A' according to some embodiments of the disclosure. While the exemplary semiconductor device 900 is shown to have four separate sets of vertical channel structures in a 2×2 array, it is understood that the exemplary semiconductor device 900 can typically include more than four separate sets of vertical channel structures in any kind of array.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a dielectric layer on or overlying a base substrate structure such as a thin film. Thus, substrate is not limited to any particular base structure, underlying dielectric layer or overlying dielectric layer, patterned or un-patterned, but rather, is contemplated to include any such dielectric layer or base structure, and any combination of dielectric layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of fabricating a semiconductor device, the method comprising:

forming a multilayer stack on a substrate, the multilayer stack including alternate metal layers and dielectric layers;

forming at least one opening through the multilayer stack to uncover the substrate;

forming at least two vertical channel structures within the opening that are stacked on each other, the vertical channel structures having source, gate and drain regions being in contact with the metal layers of the multilayer stack, respectively;

removing a central portion of the vertical channel structures; and filling the removed central portion of the vertical channel structures with a dielectric core such that the vertical channel structures are isolated from each other and from the substrate by the dielectric core.

2. The method of claim 1, wherein the vertical channel structures are of different channel types.

3. The method of claim 2, wherein forming at least two vertical channel structures includes:

forming a first epitaxial material on the substrate, the first epitaxial material covering at least a portion of a vertical sidewall of a first one of the dielectric layers of the multilayer stack;

forming a first source region of the vertical channel structures on the first epitaxial material with a first type channel material, the first source region covering a vertical sidewall of a first one of the metal layers of the multilayer stack above the first dielectric layer;

forming a first gate region of the vertical channel structures on the first source region with a first gate material, the first gate region covering a vertical sidewall of a second one of the metal layers of the multilayer stack above the first metal layer;

forming a first drain region of the vertical channel structures on the first source and gate regions with the first type channel material, the first drain region covering a vertical sidewall of a third one of the metal layers of the multilayer stack above the second metal layer;

forming a second epitaxial material on the first drain region, the second epitaxial material covering at least a portion of a vertical sidewall of a second one of the dielectric layers of the multilayer stack above the third metal layer;

forming a second source region of the vertical channel structures on the second epitaxial material with a second type channel material, the second source region covering a vertical sidewall of a fourth one of the metal layers of the multilayer stack above the second dielectric layer;

forming a second gate region of the vertical channel structures on the second source region with a second gate material, the second gate region covering a vertical sidewall of a fifth one of the metal layers of the multilayer stack above the fourth metal layer; and forming a second drain region of the vertical channel structures on the second source and gate regions with the second type channel material, the second drain region covering a vertical sidewall of a sixth one of the metal layers of the multilayer stack above the fifth metal layer.

4. The method of claim 3, wherein forming a first gate region and forming a first drain region include:

forming the first gate material on the first source region, the first gate material covering the vertical sidewalls of the second to sixth metal layers and the dielectric layers therebetween;

forming the first type channel material on the first source region aligned with the second metal layer;

removing a portion of the first gate material higher than the second metal layer such that the first gate region covers the vertical sidewall of the second metal layer; and forming the first drain region with the first type channel material such that the first drain region covers the vertical sidewall of the third metal layer.

5. The method of claim 3, wherein the first source region covers a portion of the vertical sidewall of the first dielectric layer.

6. The method of claim 3, wherein the first source region covers a portion of a vertical sidewall of a third one of the dielectric layers of the multilayer stack between the first metal layer and the second metal layer.

7. The method of claim 3, wherein the first gate material and the second gate material are the same.

8. The method of claim 3, wherein the first epitaxial material and the second epitaxial material are the same.

9. The method of claim 3, wherein removing a central portion of the vertical channel structures includes:

removing a central region of the vertical channel structures along an axis perpendicular to a top surface of the substrate; and removing the first and second epitaxial materials.

* * * * *